(12) United States Patent
Francis et al.

(10) Patent No.: US 11,604,490 B1
(45) Date of Patent: Mar. 14, 2023

(54) LOW FREQUENCY POWER SUPPLY SPUR REDUCTION IN CLOCK SIGNALS

(71) Applicant: XILINX, INC., San Jose, CA (US)

(72) Inventors: Roswald Francis, Kildare (IE); Edward Cullen, Kildare (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/500,711

(22) Filed: Oct. 13, 2021

(51) Int. Cl.
G06F 1/10 (2006.01)
H03H 11/04 (2006.01)
H02M 3/155 (2006.01)
G05F 1/46 (2006.01)

(52) U.S. Cl.
CPC ............... G06F 1/10 (2013.01); G05F 1/46 (2013.01); H02M 3/155 (2013.01); H03H 11/04 (2013.01)

(58) Field of Classification Search
None
See application file for complete search history.

(56) References Cited

U.S. PATENT DOCUMENTS

| | | | |
|---|---|---|---|
| 5,831,845 A | 11/1998 | Zhou et al. | |
| 6,114,843 A | 9/2000 | Olah | |
| 6,288,526 B1 | 9/2001 | Olah | |
| 6,504,432 B1 | 1/2003 | Rokhsaz | |
| 6,559,715 B1 | 5/2003 | Frake et al. | |
| 6,753,722 B1 | 6/2004 | Kondapalli et al. | |
| 7,109,783 B1 | 9/2006 | Kondapalli et al. | |
| 7,180,353 B2 * | 2/2007 | Chiu | G06F 1/32 327/295 |
| 7,218,168 B1 | 5/2007 | Rahman | |
| 7,265,605 B1 | 9/2007 | Vasudevan | |
| 7,313,176 B1 | 12/2007 | Groen | |
| 7,504,877 B1 | 3/2009 | Voogel et al. | |
| 7,667,489 B1 | 2/2010 | Vasudevan | |
| 7,733,075 B1 | 6/2010 | Vasudevan | |
| 7,859,918 B1 | 12/2010 | Nguyen et al. | |
| 8,198,930 B2 * | 6/2012 | Zerbe | G06F 1/10 327/158 |
| 8,710,812 B1 | 4/2014 | Edwards | |
| 8,710,883 B1 | 4/2014 | Fang et al. | |
| 9,525,423 B1 | 12/2016 | Lesea | |
| 9,696,747 B1 | 7/2017 | Tan et al. | |
| 9,746,864 B1 | 8/2017 | Narang et al. | |
| 9,804,207 B1 | 10/2017 | Lesea | |

(Continued)

*Primary Examiner* — Jeffery S Zweizig
(74) *Attorney, Agent, or Firm* — Patterson + Sheridan, LLP

(57) ABSTRACT

Techniques and apparatus for reducing low frequency power supply spurs in clock signals. One example circuit generally includes a first power supply circuit configured to generate a first power supply voltage on a first power supply rail, a second power supply circuit configured to generate a second power supply voltage on a second power supply rail, a clock distribution network, and a feedback circuit coupled between the second power supply rail and at least one input of the first power supply circuit. The feedback circuit may be configured to sense the second power supply voltage, to process the sensed second power supply voltage, and to output at least one feedback signal to control the first power supply circuit based on the processed second power supply voltage. The clock distribution network may include first and second sets of clock drivers powered by the first and second power supply voltages, respectively.

19 Claims, 9 Drawing Sheets

(56) References Cited

U.S. PATENT DOCUMENTS

| | | | |
|---|---|---|---|
| 9,847,323 B1 | 12/2017 | Lesea | |
| 9,853,642 B1 | 12/2017 | Tan et al. | |
| 9,887,710 B1 | 2/2018 | Lim et al. | |
| 9,941,880 B1 | 4/2018 | Lesea et al. | |
| 9,973,191 B2 * | 5/2018 | Klass | G06F 1/3296 |
| 10,033,412 B2 | 7/2018 | Lim et al. | |
| 10,454,418 B1 | 10/2019 | Jain et al. | |
| 10,454,463 B1 | 10/2019 | Hudner | |
| 10,469,090 B1 | 11/2019 | Zheng | |
| 10,608,630 B1 | 3/2020 | Cical et al. | |
| 11,108,706 B2 * | 8/2021 | Shino | G06F 3/00 |

\* cited by examiner

~0.01 kHz to 0.5 kHz

~10 to 20 MHz

LOW FREQUENCY POWER SUPPLY SPUR REDUCTION IN CLOCK SIGNALS

TECHNICAL FIELD

Examples of the present disclosure generally relate to electronic circuits, and more specifically, to techniques and apparatus for reducing power supply spurs in dock signals.

BACKGROUND

Many different types of electronic devices may include a dock distribution network (also referred to as a "dock distribution chain") configured to provide clock signals to various electronic circuits on the device. The clock distribution chain may include a crystal oscillator or other component(s) to provide a reference clock signal, as well as any of various suitable circuit elements configured to drive the clock signals, such as buffers and/or logic inverters. These circuit elements may receive power from one or more power supply circuits, which may be implemented by one or more voltage regulators providing regulated and/or unregulated power supply voltages on corresponding power supply rails.

A voltage regulator ideally provides a constant direct current (DC) output voltage regardless of changes in load current or input voltage. Voltage regulators may be classified as linear regulators or switching regulators. While linear regulators tend to be relatively compact, many applications may benefit from the increased efficiency of a switching regulator. A linear regulator may be implemented by a low-dropout (LDO) regulator, for example. A switching regulator (also known as a "switching converter" or "switcher") may be implemented, for example, by a switched-mode power supply (SMPS), such as a buck converter, a boost converter, a buck-boost converter, or a charge pump.

SUMMARY

Certain aspects of the present disclosure generally relate to techniques and apparatus for reducing relatively low frequency spurs in relatively high frequency clock signals, such as low frequency power supply spurs in clock distribution chains.

Certain aspects of the present disclosure provide a circuit. The circuit generally includes a first power supply circuit configured to generate a first power supply voltage on a first power supply rail, a second power supply circuit configured to generate a second power supply voltage on a second power supply rail, a clock distribution network, and a feedback circuit coupled between the second power supply rail and at least one input of the first power supply circuit. The clock distribution network includes a first set of one or more clock drivers having power supply inputs coupled to the first power supply rail and a second set of one or more clock drivers coupled to the first set of one or more clock drivers and having power supply inputs coupled to the second power supply rail. The feedback circuit is configured to sense the second power supply voltage, to process the sensed second power supply voltage, and to output at least one feedback signal based on the processed second power supply voltage. The at least one feedback signal may be configured to control the first power supply circuit and modulate (e.g., add low frequency content to) the first power supply voltage.

Certain aspects of the present disclosure provide a method of clock distribution. The method generally includes generating a first power supply voltage on a first power supply rail with a first power supply circuit, generating a second power supply voltage on a second power supply rail with a second power supply circuit, distributing a clock signal, sensing the second power supply voltage on the second power supply rail, processing the sensed second power supply voltage, and controlling the first power supply circuit based on the processed second power supply voltage. Distributing the clock signal includes operating a first set of one or more clock drivers powered by the first power supply voltage, operating a second set of one or more clock drivers powered by the second power supply voltage, and outputting a driven version of the clock signal from the first set of one or more clock drivers as input to the second set of one or more clock drivers.

Certain aspects of the present disclosure provide a circuit. The circuit generally includes a first power supply circuit configured to generate a first power supply voltage on a first power supply rail, a second power supply circuit configured to generate a second power supply voltage on a second power supply rail, a clock distribution network, and a feedback circuit coupled between the second power supply rail and at least one input of the first power supply circuit. The clock distribution network includes a first set of one or more clock drivers having power supply inputs coupled to the first power supply rail and a second set of one or more clock drivers coupled to the first set of one or more clock drivers and having power supply inputs coupled to the second power supply rail. The feedback circuit includes a filter stage and a transconductance stage. For certain aspects, the feedback circuit also includes a gain stage, which may be coupled between the filter stage and the transconductance stage.

Certain aspects of the present disclosure provide an apparatus. The apparatus generally includes means for generating a first power supply voltage; means for generating a second power supply voltage; means for distributing a clock signal; means for sensing the second power supply voltage; means for processing the sensed second power supply voltage; and means for controlling the means for generating the first power supply voltage based on the processed second power supply voltage. The means for distributing the clock signal includes first means for driving the clock signal and second means for driving a version of the clock signal received from the first means for driving, wherein the first means for driving is powered by the first power supply voltage and wherein the second means for driving is powered by the second power supply voltage.

These and other aspects may be understood with reference to the following detailed description.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Figure 1:
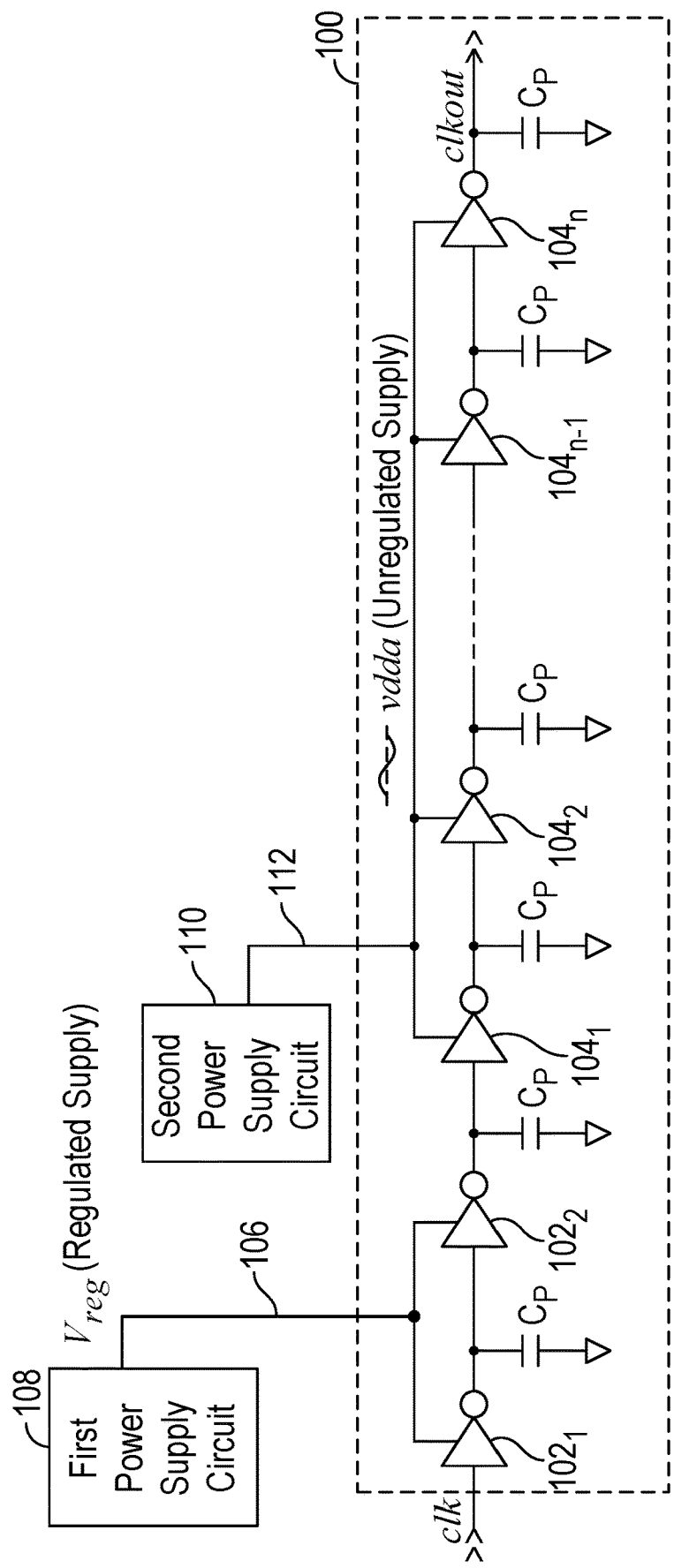
FIG. 1 is a block diagram of a clock distribution chain receiving power from two separate power supply domains, in which aspects of the present disclosure may be practiced.

Certain aspects of the present disclosure generally relate to techniques and apparatus for cancelling, or at least reducing, relatively low frequency spurs in relatively high frequency clock signals, such as low frequency power supply spurs in clock distribution chains.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example Clock Distribution Chain

An electronic device, a system on a chip (SoC), or an integrated circuit (e.g., a processor, a field-programmable gate array (FPGA), or an application-specific integrated circuit (ASIC)) may include a clock distribution chain configured to provide clock signals to various electronic circuits thereon. The clock distribution chain may include a crystal oscillator or other component(s) to provide a reference clock signal, as well as any of various suitable circuit elements configured to drive the clock signals, such as buffers and/or logic inverters. These circuit elements may receive power from one or more power supply circuits, which may be implemented by one or more voltage regulators providing regulated and/or unregulated power supply voltages on corresponding power supply rails.

FIG. 1 is a block diagram of an example clock distribution chain 100 receiving power from two separate power supply domains. As shown, the clock distribution chain 100 includes a first set of logic inverters $102_1$, $102_2$ (collectively referred to herein as the "first set of logic inverters 102") and a second set of n logic inverters $104_1$, $104_2$, . . ., $104_n$ (collectively referred to herein as the "second set of logic inverters 104"). Although the first set of logic inverters 102 includes two logic inverters in FIG. 1, the reader is to understand that the first set of logic inverters may include any suitable number of logic inverters. Likewise, the second set of logic inverters may include any suitable number of logic inverters (e.g., n is any positive integer including 1). Furthermore, it is to be understood that one or more of the logic inverters may be replaced by other types of clock drivers, such as buffers. The outputs of the logic inverters 102, 104 are represented as having a shunt parasitic capacitance Cp to electrical ground.

During operation, the logic inverter $102_1$ receives the clock signal (labeled "clk") at its input and generates a complementary clock signal (clk_bar) at its output. The clock signal may have a relatively high frequency of hundreds of MHz to tens of GHz, for example. The clock distribution chain 100 propagates the clock signal from the input of the logic inverter $102_1$ to the output of the logic inverter $104_n$. The propagated clock signal at the output of the logic inverter $104_n$ is labeled "clkout" and may be the same as or the inverse of clk, depending on the numbers and types of clock drivers in the clock distribution chain 100.

The first set of logic inverters 102 have power supply inputs coupled to a first power supply rail 106 having a regulated power supply voltage (labeled "Vreg") generated by a first power supply circuit 108. For example, the first power supply circuit 108 may be a linear voltage regulator. For certain aspects, the first power supply circuit 108 may be an on-chip power supply circuit, meaning that the first power supply circuit is located in the same semiconductor die as the clock distribution chain 100. The second set of logic inverters 104 have power supply inputs coupled to a second power supply rail 112 generated by a second power supply circuit 110. The second power supply circuit 110 may generate an unregulated power supply voltage (labeled "vdda") on the second power supply rail 112. For certain aspects, the second power supply circuit 110 may be an off-chip power supply circuit, meaning that the second power supply circuit is not located in the same semiconductor die as the clock distribution chain 100.

In some cases, the second power supply circuit 110 may be a switching regulator, which may have a relatively low switching frequency in a range of 100 kHz to a few MHz, for example. Therefore, the second power supply circuit 110 may introduce this low frequency content into the second power supply rail 112, which may modulate the edges of the clock signals in the second set of logic inverters 104 and create spurs in the clkout signal at the output of the clock distribution chain 100. In a transceiver chain, for example, such spurs may mix with data signals and may appear as spurious tones.

Example Low Frequency Spur Reduction in Clock Signals

Certain aspects of the present disclosure provide techniques and apparatus for eliminating, or at least reducing, these low frequency power supply spurs in clock signals. For certain aspects, this clock spur reduction may be accomplished by modulating the linear regulator output voltage ($V_{reg}$) with an opposite polarity signal based on the switching regulator output voltage (vdda). For example, the switching regulator output voltage may be sensed, bandpass filtered to determine the low frequency content (excluding DC), amplified to an appropriate amplitude, inverted, and injected into the linear regulator. In this manner, the linear regulator output voltage ($V_{reg}$) will be modulated with the low frequency content of the switching regulator, but with the opposite polarity, such that this intentional modulation in the edges of the clock signals in the first set of logic inverters 102 may counteract the modulation in the edges of the clock signals in the second set of logic inverters 104. In this manner, the power in the clkout spurs at the output of the clock distribution chain 100 will be reduced.

Figure 2:
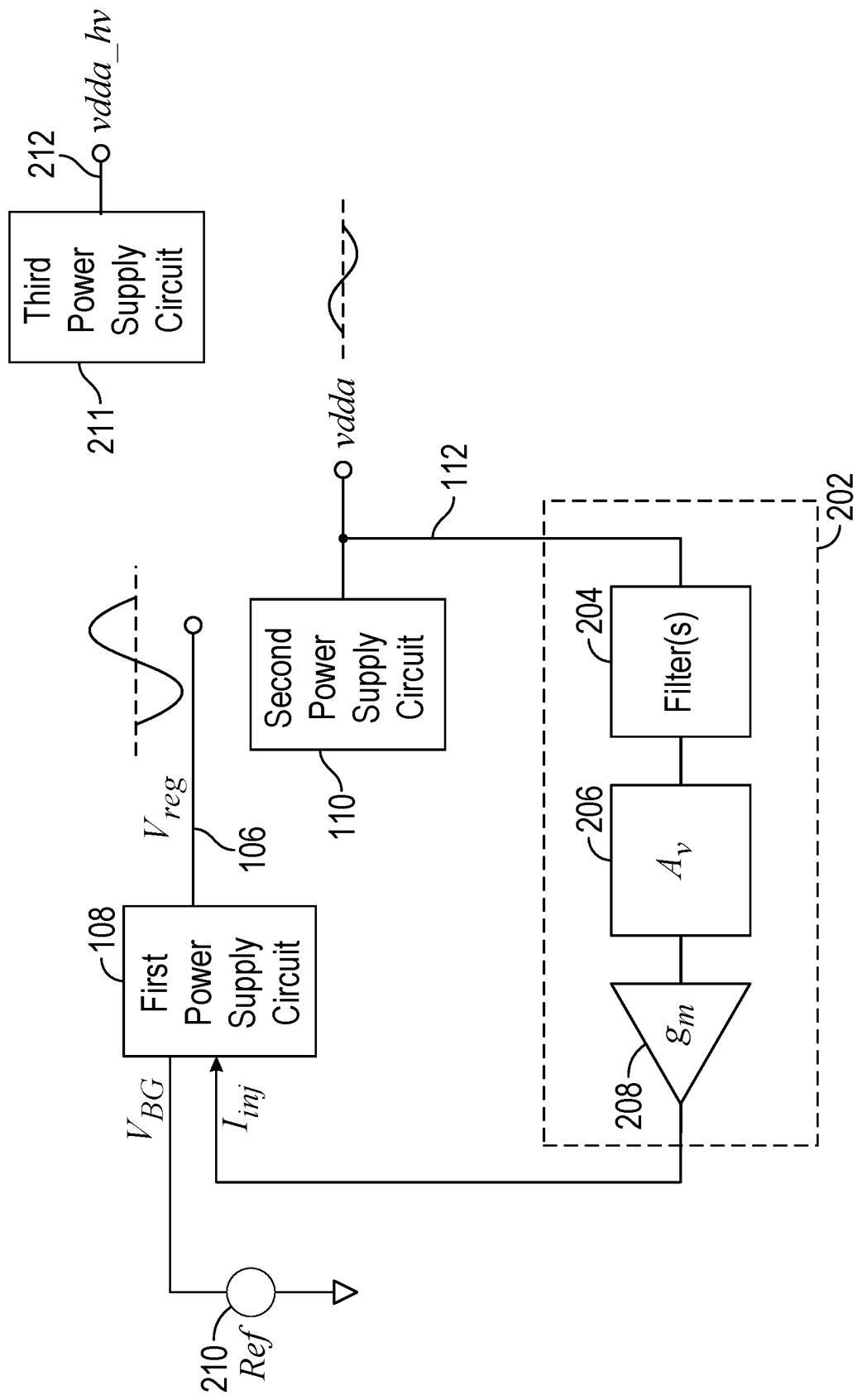
FIG. 2 is a block diagram of a first power supply circuit (e.g., a linear voltage regulator), a second power supply circuit, and a feedback circuit configured to modulate the output of the first power supply circuit based on the output of the second power supply circuit, according to certain aspects of the present disclosure.

FIG. 2 is a block diagram of an example feedback circuit 202 configured to modulate the output of the first power supply circuit 108 based on the output of the second power supply circuit 110, according to certain aspects of the present disclosure. As illustrated, the feedback circuit 202 includes a filter stage 204, a gain stage 206 (with gain "$A_v$"), and a transconductance ($g_m$) stage 208. The feedback circuit 202 is configured to sense the output voltage of the second power supply circuit 110 (e.g., the unregulated power supply voltage vdda of a switching regulator), filter the sensed voltage with the filter stage 204, amplify the filtered voltage with the gain stage 206, convert the amplified voltage to a current with the transconductance stage 208, and inject the current (labeled "$I_{inj}$") into the first power supply circuit 108. The filter stage 204 may be implemented with a bandpass filter, with a difference between low-pass filters (as illustrated in and described below with respect to FIG. 3) to effectively implement a bandpass filter, or with a difference between high-pass filters (as illustrated in and described below with respect to FIG. 6) to effectively implement a bandpass filter. The gain ($A_v$) of the gain stage 206 may be determined by simulation and/or testing and may be based on the number of inverters in the second set of logic inverters 104 versus the number of inverters in the first set of logic inverters 102. The higher this ratio is, the higher the gain ($A_v$) of the gain stage 206 may be. For certain aspects, the transconductance stage 208 may have a sufficient gain, such that the gain stage 206 may be eliminated (i.e., the gain stage 206 and the transconductance stage 208 are combined into a single stage, as illustrated in and described below with respect to FIG. 8).

The first power supply circuit 108 may receive a reference voltage (e.g., a bandgap reference voltage labeled "$V_{BG}$") from a bandgap voltage reference 210, as shown. As described above, the first power supply circuit 108 may be implemented as a linear voltage regulator. In this case, the linear regulator may be implemented as a buffer (e.g., an amplifier having a positive input coupled to the bandgap voltage reference 210 and having a negative input coupled to the output of the amplifier in a feedback loop) configured to output a voltage $V_{reg}$ equivalent to $V_{BG}$. An example implementation of the first power supply circuit 108 as a buffer is illustrated in and described below with respect to FIG. 5). Due to the injection of the current from the feedback circuit 202, the voltage $V_{reg}$ is modulated with an AC signal opposite in polarity to the low frequency content on the voltage vdda, as shown.

In addition, FIG. 2 illustrates a third power supply circuit 211 for generating a voltage labeled "vdda_hv" on a third power supply rail 212. The voltage vdda_hv has a higher voltage than the voltage vdda. For certain aspects, the third power supply circuit 211 may be an off-chip power supply circuit. The third power supply circuit may be a switching regulator, for example. The purpose of the vdda_hv voltage is explained below.

With the technique described herein, the penalty on the clock signal jitter due to the addition of a cancellation branch (e.g., the feedback circuit 202) to the first power supply circuit 108 is negligible compared to the overall docking network jitter. This technique is also independent of the clock frequency and the rise and fall times of the clock signals. This is because the spur cancellation, or at least reduction, is done for very low frequencies compared to the end-to-end delay of the clock distribution chain.

Figure 3:
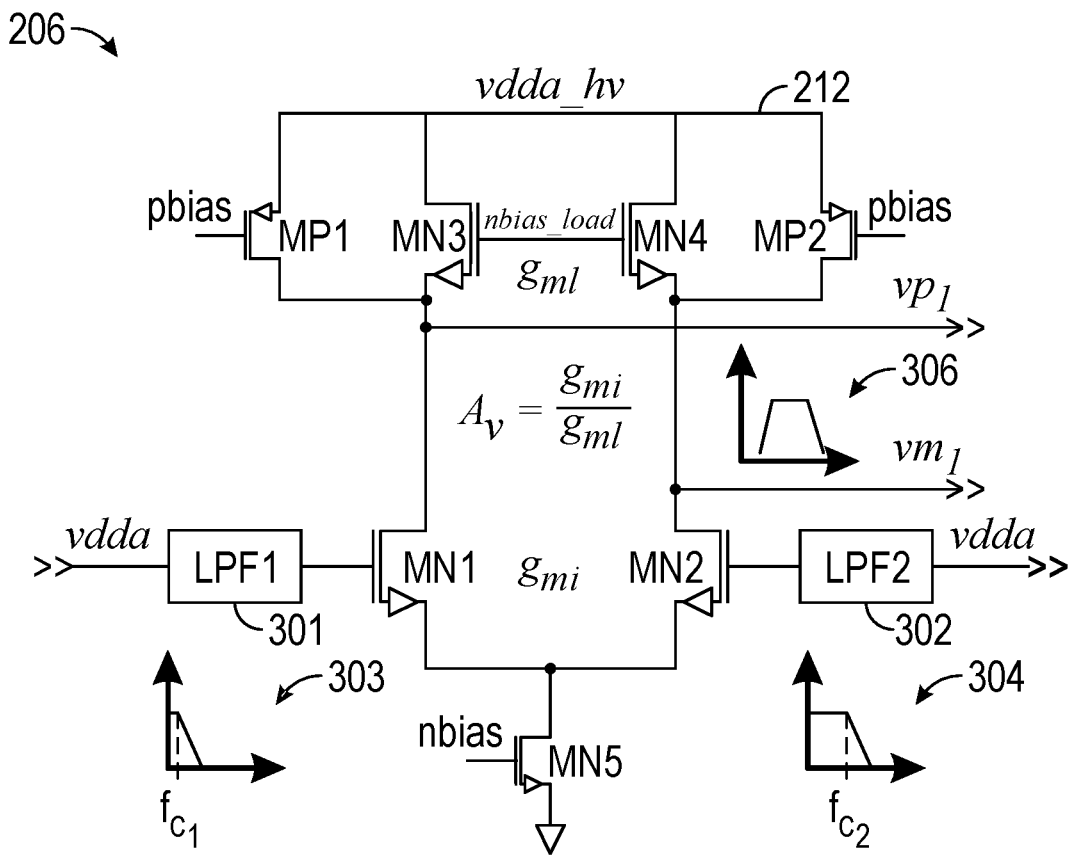
FIG. 3 is a circuit diagram illustrating example implementations of the gain stage and the transconductance stage of the feedback circuit of FIG. 2 using low-pass filters, according to certain aspects of the present disclosure.
Figure 3:
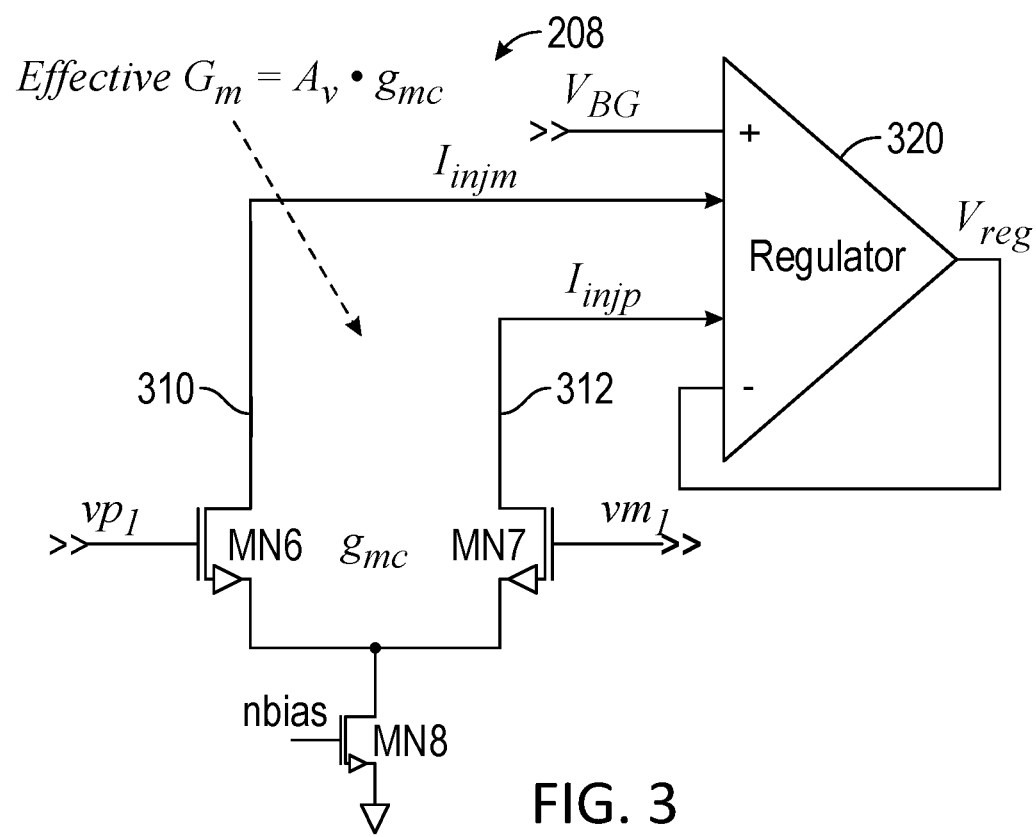

FIG. 3 is a circuit diagram illustrating example implementations of the filter stage 204, the gain stage 206, and the transconductance stage 208 of the feedback circuit 202 of FIG. 2 using low-pass filters, according to certain aspects of the present disclosure. In FIG. 3, the filter stage 204 is implemented with two low-pass filters 301, 302 (labeled "LPF1" and "LPF2" respectively). The low-pass filter 301 has a low-pass frequency response 303 with a first cutoff frequency ($f_{c1}$), and the low-pass filter 302 has a low-pass frequency response 304 with a second cutoff frequency ($fc_2$), which is greater than the first cutoff frequency. The low-pass filters 301, 302 may be implemented by any of various suitable circuits with the desired low-pass frequency responses, such as those shown in FIGS. 4A and 4B.

As illustrated in the example of FIG. 3, the gain stage 206 may be implemented by a differential amplifier having differential inputs (e.g., from the outputs of the low-pass filters 301, 302) and differential outputs (labeled "$vp_1$" and "$vm_1$"). The differential amplifier may include a differential input stage implemented by n-type transistors MN1 and MN2, a differential load implemented by n-type transistors MN3 and MN4 and p-type transistors MP1 and MP2, and a quiescent current source implemented by an n-type transistor MN5. The gate of transistor MN1 is coupled to the output of the low-pass filter 301, and the gate of transistor MN2 is coupled to the output of the low-pass filter 302. The sources of transistors MN1 and MN2 are coupled to the drain of transistor MN5. The drain of transistor MN1 is coupled to the positive output node $vp_1$, and the drain of transistor MN2 is coupled to the negative output node $vm_1$. The transconductance of transistor MN1 (or transistor MN2) is labeled "$g_{mi}$" for input transconductance. The drains of transistors MN3 and MN4 are coupled to the third power supply rail 212 having voltage vdda_hv, as are the sources of transistors MP1 and MP2. The gates of transistors MN3 and MN4 are coupled to a bias voltage node labeled "nbias_load." The gates of transistors MP1 and MP2 are coupled to a bias voltage node (labeled "pbias"). The source of transistor MN3 and the drain of transistor MP1 are coupled to the positive output node $vp_1$, and the source of transistor MN4 and the drain of transistor MP2 are coupled to the negative output node $vm_1$. The transconductance of transistor MN3 (or transistor MN4) is labeled "$g_{ml}$" for load transconductance. The gate of transistor MN5 is coupled to another bias voltage node (labeled "nbias"), and the source of transistor MN5 is coupled to a reference potential node (e.g., electrical ground) for the feedback circuit 202.

The gain of the gain stage 206 as implemented in FIG. 3 is equal to the input transconductance divided by the load transconductance ($A_v = g_{mi}/g_{ml}$). In other words, the gain of the gain stage 206 may be set by the transconductance of transistors MN1 and MN2 and the transconductance of transistors MN3 and MN4, and the gain may be altered (e.g., tuned) by changing the transconductance of transistors MN1 and MN2, the transconductance of transistors MN3 and MN4, or both.

With this differential amplifier as described, the differential output across the positive output node $vp_1$ and the negative output node $vm_1$ will have a bandpass frequency response 306. This bandpass frequency response is based on the difference between the low-pass frequency response 304 and the low-pass frequency response 303. In this manner, the differential amplifier is amplifying the low frequency content (e.g., the spur component(s)) of the unregulated supply voltage vdda and not the DC value of vdda (or higher frequency noise or transients).

As illustrated in the example of FIG. 3, the transconductance stage 208 may include a differential input stage implemented by n-type transistors MN6 and MN7 and a quiescent current source implemented by an n-type transistor MN8. The gate of transistor MN6 may be coupled to the positive output node $vp_1$, whereas the gate of transistor MN7 may be coupled to the negative output node $vm_1$. The sources of transistors MN6 and MN7 are coupled to the drain of transistor MN8. The gate of transistor MN8 may be coupled to the bias voltage node nbias, and the source of transistor MN8 is coupled to the reference potential node (e.g., electrical ground) for the feedback circuit 202.

The drain of transistor MN6 is coupled to a negative injection current input node 310 (labeled "$I_{injm}$" which may also refer to the negative injection current itself) of a voltage regulator, such as a differential linear regulator 320. The drain of transistor MN7 is coupled to a positive injection current input node 312 (labeled "$I_{injp}$" which may also refer to the positive injection current itself) of the voltage regulator, such as the differential linear regulator 320. The differential linear regulator 320 is not part of the transconductance stage 208, but is included in FIG. 3 to illustrate example outputs from the transconductance stage and how these outputs may be applied as some of the various inputs to the regulator 320. The positive input of the differential linear regulator 320 may be coupled to the bandgap voltage reference 210 (as described above with respect to FIG. 2). The negative input of the differential linear regulator 320 may be coupled to the output thereof, in a feedback loop, such that the differential linear regulator may function as a buffer.

The transconductance of transistor MN6 (or transistor MN7) is labeled "$g_{mc}$" and represents the transconductance of the transconductance stage 208. Therefore, the effective total transconductance ($G_m$) for the feedback circuit 202 is equal to the gain of the gain stage 206 multiplied by the transconductance of the transconductance stage 208 ($G_m = A_v * g_{mc}$).

In the example implementation of FIG. 3, the transistors in the gain stage 206 and in the transconductance stage 208 (with the exception of p-type transistors MP1, MP2) may be operated in a subthreshold region for low noise and transconductance scaling.

Figure 4A:
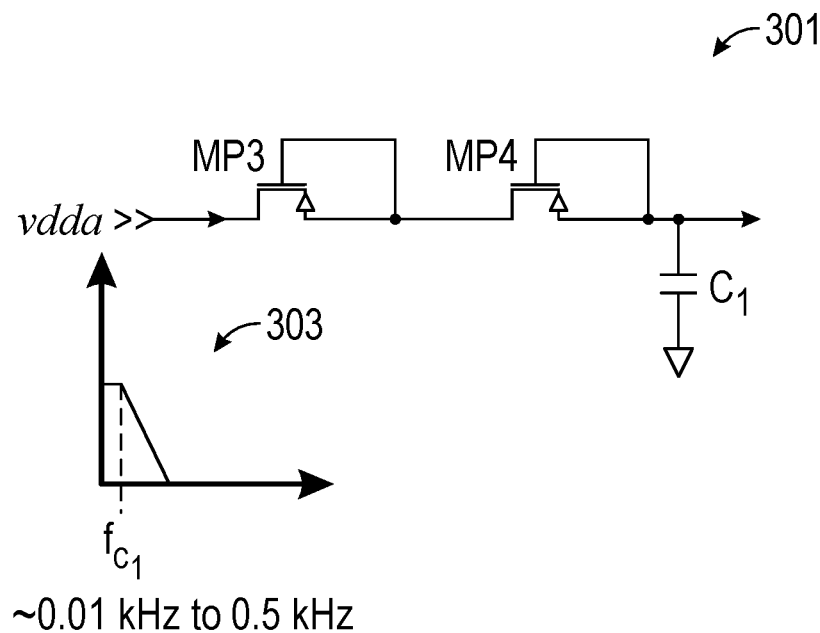
FIGS. 4A and 4B illustrate example circuit implementations and frequency responses for the low-pass filters of FIG. 3, according to certain aspects of the present disclosure.

FIG. 4A illustrates an example circuit diagram for implementing the low-pass filter 301, according to certain aspects of the present disclosure. In this example, the low-pass filter 301 includes two p-type transistors MP3, MP4 and a shunt capacitor $C_1$. The drain of transistor MP3 is coupled to the input of the low-pass filter 301, which may be coupled to the second power supply rail 112 with the unregulated supply voltage vdda. The source of transistor MP3 is coupled to the gate thereof and to the drain of transistor MP4. The source of transistor MP4 is coupled to the gate thereof, to a first terminal of capacitor $C_1$, and to the output of the low-pass filter 301, The second terminal of capacitor $C_1$ is coupled to the reference potential node (e.g., electrical ground) for the low-pass filter 301.

In this manner, the transistors MP3, MP4 are operated in the subthreshold region to have very large drain-to-source resistances, such that the single-pole low-pass filter 301 has a low cutoff frequency ($f_{c1}$) of around 0.01 kHz to 0.5 kHz, for example, to implement the low-pass frequency response 303, without employing a large capacitance for capacitor $C_1$, which may most likely occupy a large area. Therefore, the low-pass filter 301 may occupy a relatively small area, Furthermore, the resistances of the transistors MP3, MP4 track with process, voltage, and temperature (PVT). For certain aspects, more or less than two p-type transistors may be connected in series for the low-pass filter 301. The number and/or arrangement of the p-type transistors and/or the capacitance of capacitor $C_1$ may be changed to adjust the cutoff frequency ($f_{c1}$) of the low-pass filter 301, thereby effectively altering the frequency range over which cancellation occurs (e.g., effectively changing the bandpass frequency response 306) in the feedback circuit 202.

Figure 4B:
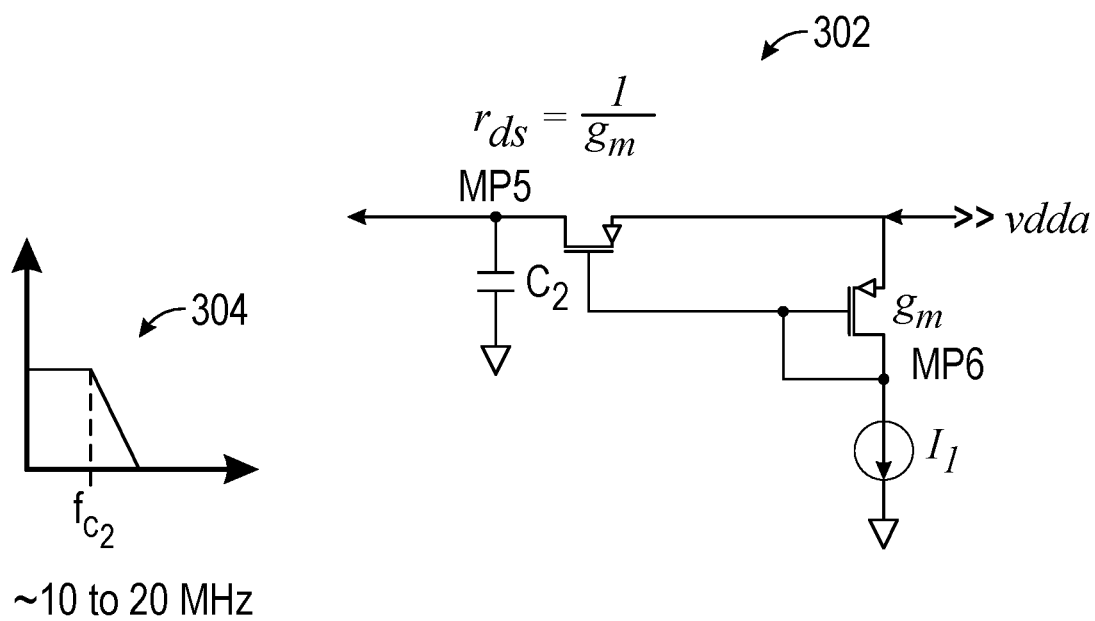

FIG. 4B illustrates an example circuit diagram for implementing the low-pass filter 302, according to certain aspects of the present disclosure. In this example, the low-pass filter 302 includes two p-type transistors MP5, MP6, a current sink and a shunt capacitor $C_2$. The source of transistor MP5 and the source of transistor MP6 are coupled to the input of the low-pass filter 302, which may be coupled to the second power supply rail 112 with the unregulated supply voltage vdda. The drain of transistor MP5 is coupled to a first terminal of capacitor $C_2$, and the second terminal of capacitor $C_2$ is coupled to the reference potential node (e.g., electrical ground) for the low-pass filter 302. The gate of transistor MP5 is coupled to the gate and the drain of transistor MP6 and to a first terminal of the current sink $I_1$. The second terminal of the current sink $I_1$ is coupled to the reference potential node (e.g., electrical ground) for the low-pass filter 302.

The transistors MP5 and MP6 may be the same type, having the same transconductance ($g_m$), which may be around 10 millimhos, for example. In this example, the drain-to-source resistance ($r_{ds}=1/g_m$) of transistor MP5 may be around 100Ω. The current sink $I_1$ may sink a small current, such as 1 µA. Transistor MP6 and the current sink $I_1$ may serve to bias transistor MP5. With the circuit connected as shown in FIG. 4B, the single-pole low-pass filter 302 may have a cutoff frequency ($f_{c2}$) of around 10 to 20 MHz, for example, to implement the low-pass frequency response 304. Furthermore, the resistances of the transistors MP5, MP6 track with PVT. For certain aspects, more than one p-type transistor may be connected in series for the low-pass filter 302. The number and/or arrangement of the p-type transistors and/or the capacitance of capacitor $C_2$ may be changed to adjust the cutoff frequency ($f_{c2}$) of the low-pass filter 302, thereby effectively altering the frequency range over which cancellation occurs (e.g., effectively changing the bandpass frequency response 306) in the feedback circuit 202.

Figure 5:
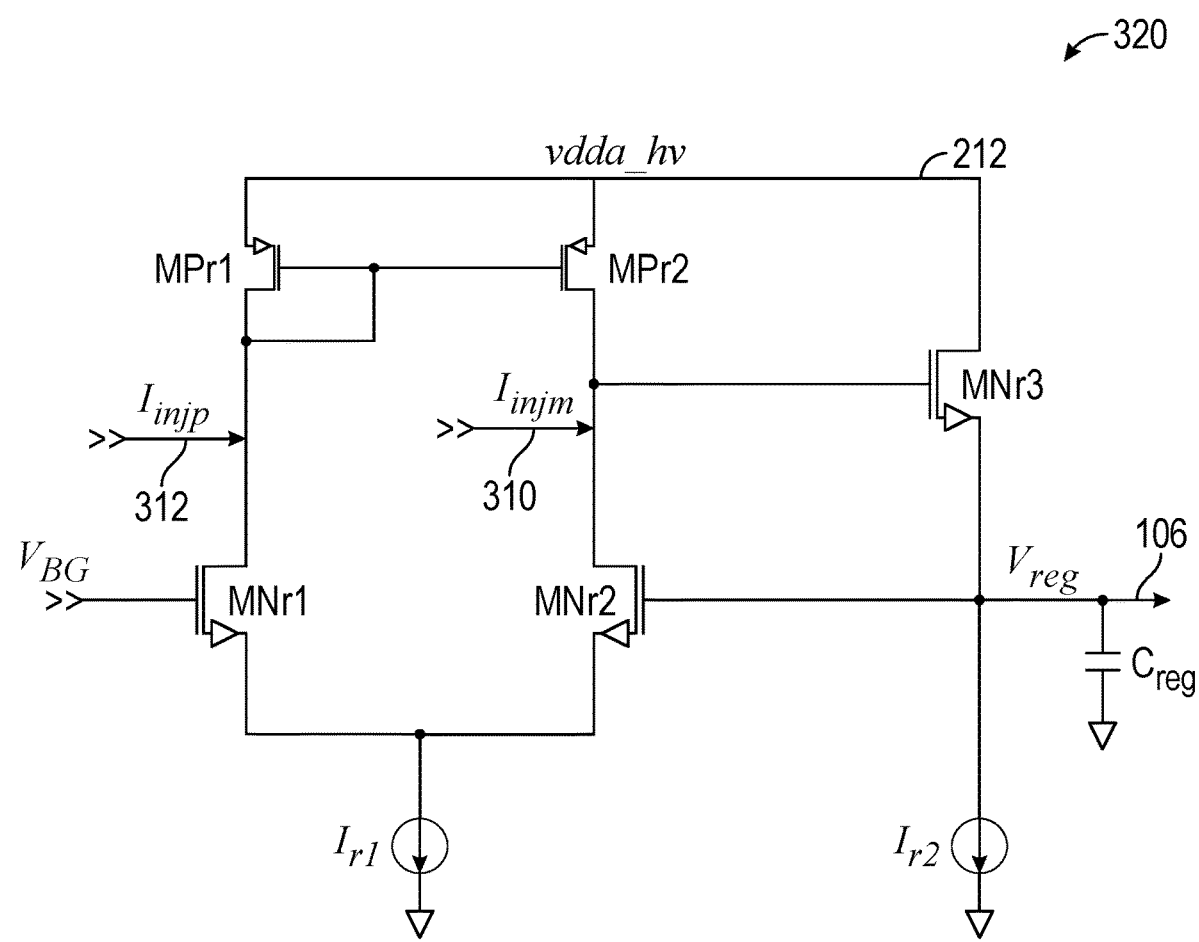
FIG. 5 is a circuit diagram illustrating an example implementation of a linear voltage regulator, according to certain aspects of the present disclosure.

FIG. 5 is a circuit diagram illustrating an example implementation of the differential linear regulator 320 of FIG. 3, according to certain aspects of the present disclosure. The regulator 320 includes a differential input stage implemented by n-type transistors MNr1, MNr2, a quiescent current source implemented by current sink a current mirror load implemented by p-type transistors MPr1, MPr2, and an output stage implemented by n-type transistor MNr3 and current sink $I_{r2}$. For certain aspects, a shunt capacitor $C_{reg}$ may be coupled to the output of the regulator 320 (e.g. to the first power supply rail 106).

As depicted in FIG. 5, the sources of transistors MNr1 and MNr2 are coupled to the current sink The gate of transistor MNr1 may represent the positive input of the regulator 320 and may be coupled to the bandgap voltage reference 210 having voltage $V_{BG}$ as shown. The drain of transistor MNr1 is coupled to the positive injection current input node 312 and to a first branch of the current mirror load via the drain of transistor MPr1. The gate of transistor MNr2 may represent the negative input of the regulator 320, which is coupled to the output of the regulator 320 to form a feedback loop. The drain of transistor MNr2 is coupled to the negative injection current input node 310 and to a second branch of the current mirror load via the drain of transistor MPr2. The sources of transistors MPr1 and MPr2 are coupled to the third power supply rail 212 having voltage vdda_hv. The gate of transistor MPr2 is coupled to the gate and the drain of transistor MPr1. In the output stage, the drain of transistor MNr3 may be coupled to the third power supply rail 212, the gate of transistor MNr3 may be coupled to the drain of transistor MNr2 (as well as to the drain of transistor MPr2 and the negative injection current input node 310), and the source of transistor MNr3 is coupled to the output of the regulator 320 and to the current sink $I_{r2}$.

With this circuit implementation, the differential compensation currents $I_{injm}$ and $I_{injp}$ generated by the feedback circuit 202 are added to the outputs of the differential input stage of the regulator 320, the positive injection current $I_{injp}$ being added to the positive branch of the differential input stage, and the negative injection current $I_{injm}$ being added to the negative branch of the differential input stage. In this manner, the output voltage ($V_{reg}$) of the regulator 320 will be modulated with the low frequency content of the unregulated supply voltage (vdda), but with the opposite polarity, such that the power supply spurs will be reduced in the clock signals (e.g., clkout).

Figure 6:
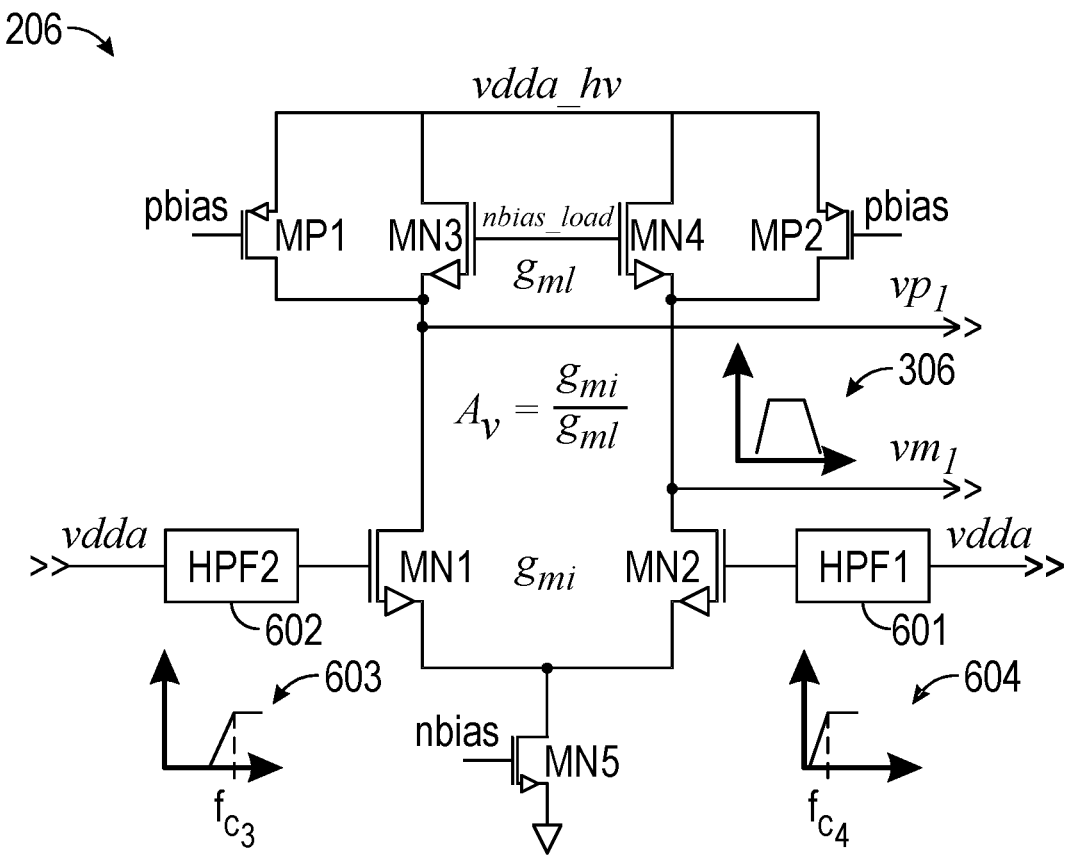
FIG. 6 is a circuit diagram illustrating example implementations of the gain stage and the transconductance stage of FIG. 2 using high-pass filters, according to certain aspects of the present disclosure.
Figure 6:
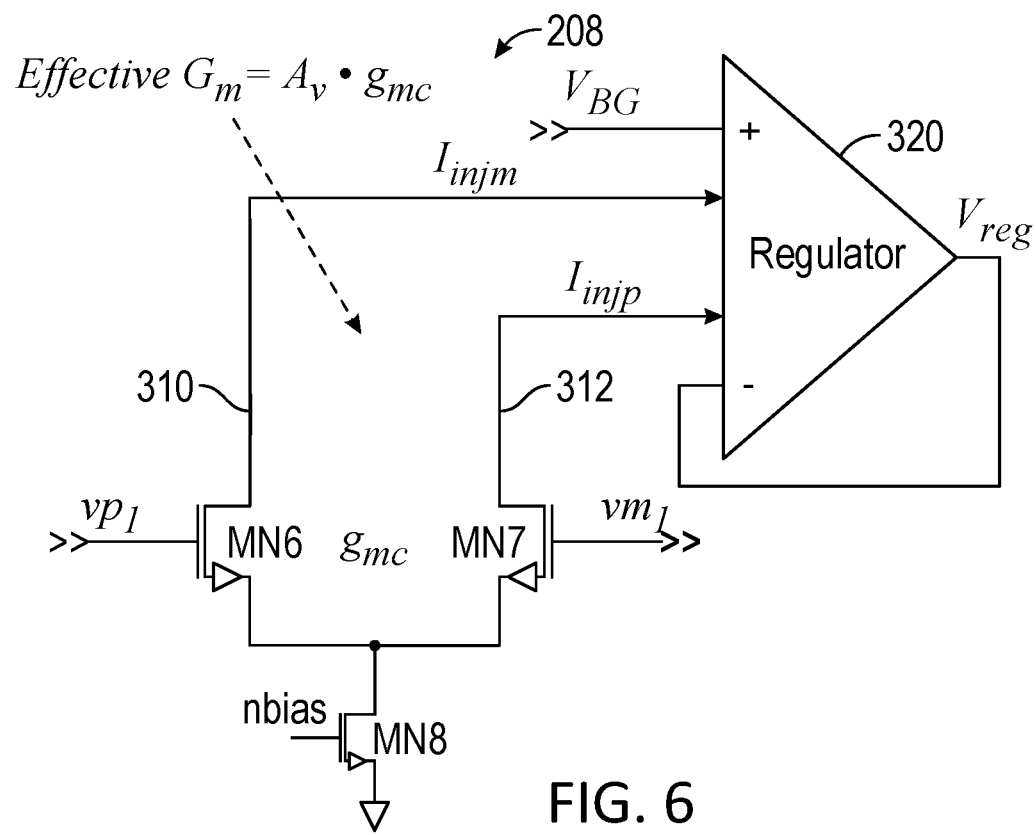

For certain aspects, the bandpass frequency response 306 of the gain stage 206 may be achieved using high-pass filters instead of the low-pass filters 301, 302 illustrated in FIG. 3. For example, FIG. 6 is another circuit diagram illustrating example implementations of the filter stage 204, the gain stage 206, and the transconductance stage 208 of the feedback circuit 202 of FIG. 2, according to certain aspects of the present disclosure. Unlike FIG. 3, the filter stage 204 in FIG. 6 is implemented with two high-pass filters 601, 602 (labeled "HPF1" and "HPF2," respectively). The high-pass filter 602 has a high-pass frequency response 603 with a third cutoff frequency ($f_{c3}$), and the high-pass filter 601 has a high-pass frequency response 604 with a fourth cutoff frequency ($f_{c4}$), which is lower than the third cutoff frequency. The high-pass filters 601, 602 may be implemented by any of various suitable circuits with the desired high-pass frequency responses, such as those depicted in FIGS. 7A and 7B.

In FIG. 6, the gain stage 206 and the transconductance stage 208 may have the same implementation as described above with respect to FIG. 3, and the differential output across the positive output node $vp_1$ and the negative output node $vm_1$ may have a similar bandpass frequency response 306. This bandpass frequency response is based on the difference between the high-pass frequency response 604 and the high-pass frequency response 603. In this manner, the differential amplifier is amplifying the low frequency content (e.g., the spur component(s)) of the unregulated supply voltage vdda and not the DC value of vdda (or higher frequency noise or transients).

Figure 7A:
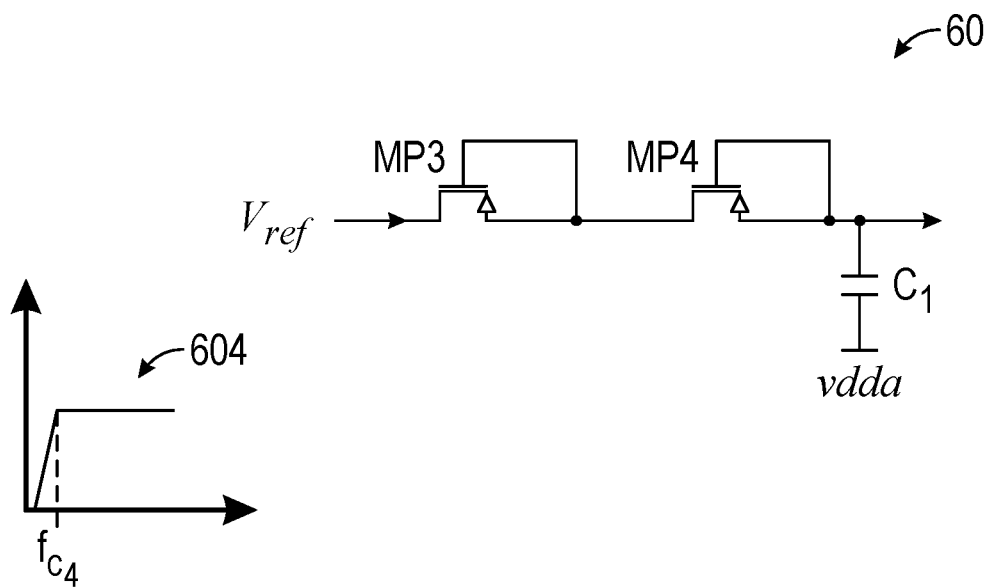
FIGS. 7A and 7B illustrate example circuit implementations and frequency responses for the high-pass filters of FIG. 6, according to certain aspects of the present disclosure.

FIG. 7A illustrates an example circuit diagram for implementing the high-pass filter 601, according to certain aspects of the present disclosure. In this example, the high-pass filter 601 includes a series capacitor $C_1$ and two shunt p-type transistors MP3, MP4 connected in series. A first terminal of capacitor $C_1$ is coupled to the input of the high-pass filter 601, which may be coupled to the second power supply rail 112 with the unregulated supply voltage vdda. A second terminal of capacitor $C_1$ is coupled to the output of the high-pass filter 601 and to the source and the gate of transistor MP4. The drain of transistor MP4 is coupled to the source and the gate of transistor MP3. The drain of transistor MP3 is coupled to a reference potential node having voltage Vref (e.g., the common-mode voltage between the transistors MN1 and MN2 of the gain stage 206) for the high-pass filter 601.

In this manner, the transistors MP3, MP4 are operated in the subthreshold region to have large drain-to-source resistances, and the single-pole high-pass filter 601 may have a cutoff frequency ($f_{c4}$) of around 0.01 to 0.5 kHz, for example, with a small capacitance for capacitor $C_1$ to implement the high-pass frequency response 604. Therefore, the high-pass filter 601 may occupy a relatively small area. Furthermore, the resistances of the transistors MP3, MP4 track with process, voltage, and temperature (PVT). For certain aspects, more or less than two p-type transistors may be connected in series for the high-pass filter 601. The number and/or arrangement of the p-type transistors and/or the capacitance of capacitor $C_1$ may be changed to adjust the cutoff frequency ($f_{c4}$) of the high-pass filter 601, thereby effectively altering the frequency range over which cancellation occurs (e.g., effectively changing the bandpass frequency response 306) in the feedback circuit 202.

Figure 7B:
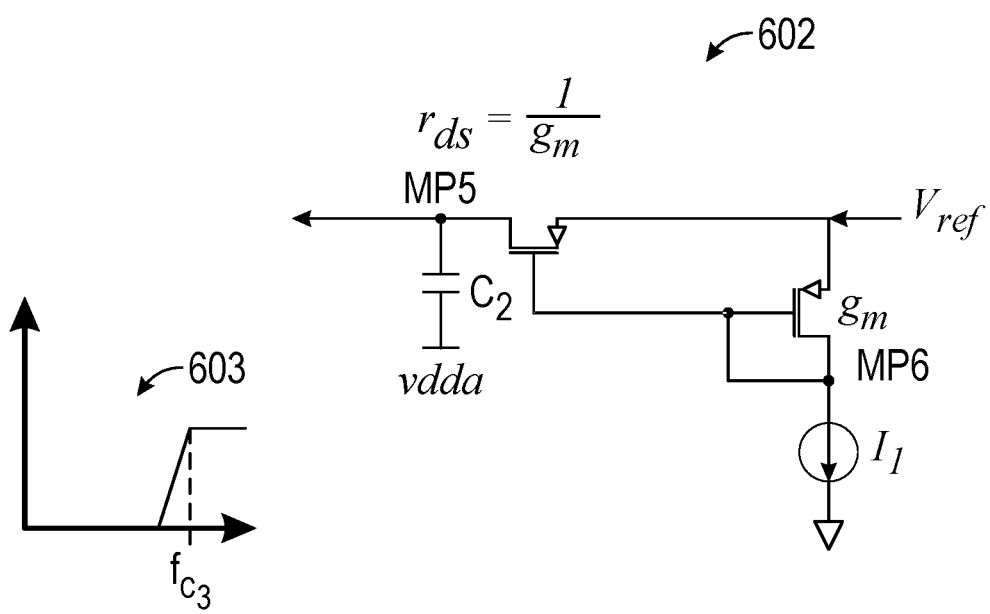

FIG. 7B illustrates an example circuit diagram for implementing the high-pass filter 602, according to certain aspects of the present disclosure, in this example, the high-pass filter 602 includes a series capacitor $C_2$, two p-type transistors MP5, MP6, and a current sink $I_1$. A first terminal of capacitor $C_2$ is coupled to the input of the high-pass filter 602, which may be coupled to the second power supply rail 112 with the unregulated supply voltage vdda. A second terminal of capacitor $C_2$ is coupled to the output of the high-pass filter 602 and to the drain of transistor MP5. The source of transistor MP5 and the source of transistor MP6 are coupled to a reference potential node for the high-pass filter 602, having voltage Vref (e.g., the common-mode voltage between the transistors MN1 and MN2 of the gain stage 206). The gate of transistor MP5 is coupled to the gate and the drain of transistor MP6 and to a first terminal of the current sink The second terminal of the current sink $I_1$ is coupled to a reference potential node (e.g., electrical ground) for the feedback circuit 202.

The transistors MP5 and MP6 may be the same type, having the same transconductance ($g_m$). Transistor MP6 and the current sink 11 may serve to bias transistor MP5. With the circuit connected as shown in FIG. 7B, the single-pole high-pass filter 602 may have a high cutoff frequency ($f_{c3}$) of around 10 to 20 MHz, for example, to implement the high-pass frequency response 603. Furthermore, the resistances (and the transconductances) of the transistors MP5, MP6 track with PVT. For certain aspects, more than one p-type transistor may be connected in series for the high-pass filter 602. The number and/or arrangement of the shunt p-type transistors and/or the capacitance of capacitor $C_2$ may be changed to adjust the cutoff frequency ($f_{c3}$) of the high-pass filter 602, thereby effectively altering the frequency range over which the cancellation occurs (e.g., effectively changing the bandpass frequency response 306) in the feedback circuit 202.

Figure 8:
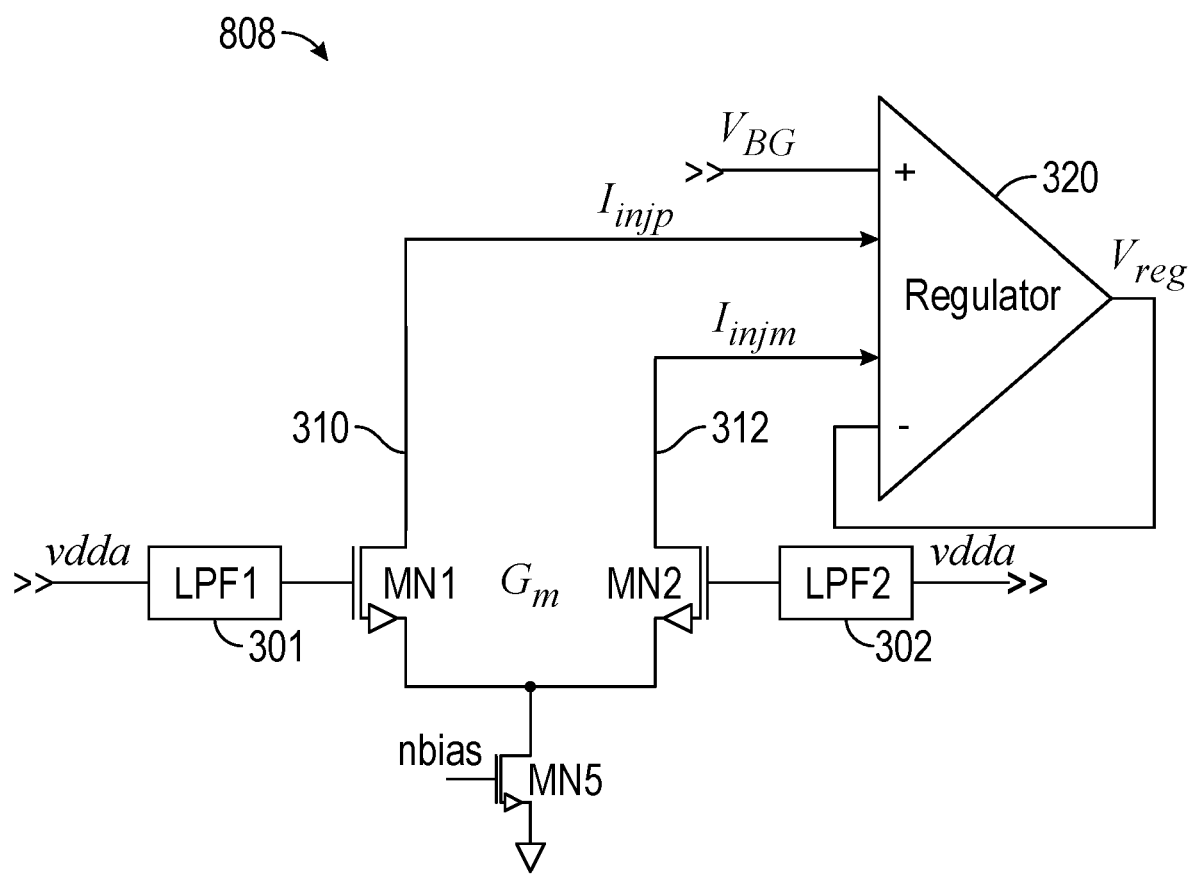
FIG. 8 is a circuit diagram illustrating an alternative implementation combining the gain stage and the transconductance stage of the feedback circuit of FIG. 2 using low-pass filters, according to certain aspects of the present disclosure.

For certain aspects, the gain stage 206 and the transconductance stage 208 of the feedback circuit 202 of FIG. 2 may be combined. For example, FIG. 8 is a circuit diagram illustrating an alternative implementation with a single transconductance stage 808 having the desired gain, according to certain aspects of the present disclosure. In this case, the differential input stage implemented by n-type transistors MN1 and MN2 may also function as part of a transconductance stage. As such, the transistors MN1 and MN2 may have the desired total transconductance ($G_m$) for the feedback circuit 202 and may have drains coupled to the injection current input nodes 310, 312, respectively, as shown. Although low-pass filters 301, 302 are illustrated in FIG. 8, it is to be understood that high-pass filters (e.g., high-pass filters 601, 602) may alternatively be used.

Example Operations

Figure 9:
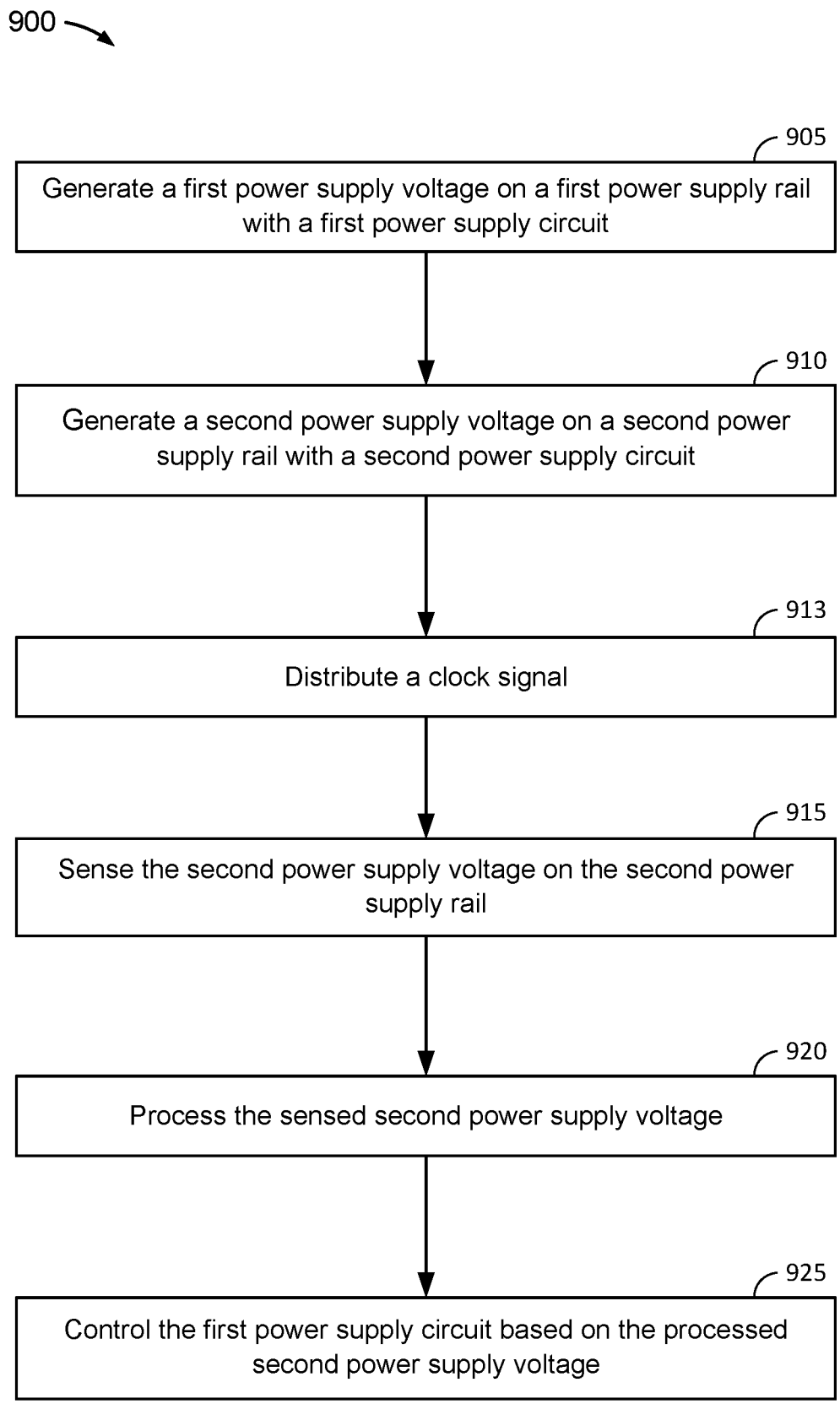
FIG. 9 is a flow diagram of example operations for dock distribution, according to certain aspects of the present disclosure.

FIG. 9 is a flow diagram of example operations 900 for clock distribution, according to certain aspects of the present disclosure. The operations 900 may be performed by power supply circuitry (e.g., the first power supply circuit 108 and the second power supply circuit 110) and a clock distribution network (e.g., the clock distribution chain 100) powered by the power supply circuitry.

The operations 900 may begin, at block 905, by generating a first power supply voltage on a first power supply rail with a first power supply circuit. At block 910, a second power supply may generate a second power supply voltage on a second power supply rail.

At block 913, a clock signal may be distributed. Distributing the clock signal may involve operating a first set of one or more clock drivers powered by the first power supply voltage and operating a second set of one or more clock drivers powered by the second power supply voltage. An output of the first set of clock drivers may be coupled to an input of the second set of clock drivers. For certain aspects, distributing the clock signal at block 913 may also include outputting a driven version of the clock signal from the first set of one or more dock drivers as input to the second set of one or more clock drivers.

At block 915, the second power supply voltage on the second power supply rail may be sensed, and the sensed second power supply voltage may be processed at block 920. At block 925, the first power supply circuit may be controlled based on the processed second power supply voltage. For example, the first power supply circuit may be controlled by modulating the first power supply voltage based on the processed second power supply voltage to control.

According to certain aspects, processing the sensed second power supply voltage at block 920 may include filtering the sensed second power supply voltage, amplifying the filtered second power supply voltage, converting the amplified second power supply voltage to a current signal, and inverting the current signal to generate at least one feedback signal, wherein the controlling comprises controlling the first power supply circuit using the at least one feedback signal.

According to certain aspects, during the controlling, the first power supply voltage has a first low frequency content with opposite polarity to a second low frequency content of the second power supply voltage.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

For example, means for generating a first power supply voltage may include a first power supply circuit, such as the first power supply circuit 108 illustrated in FIGS. 1 and 2 or the differential linear regulator 320 depicted in FIGS. 3, 5, and 6. The first power supply circuit may be a linear regulator, for example. Means for generating a second power supply voltage may include a second power supply circuit, such as the second power supply circuit 110 illustrated in FIGS. 1 and 2. The second power supply circuit may be a switching regulator, for example. Means for sensing the second power supply voltage may include a conductor, such as a wire or trace, which may be part of a power supply rail, such as the second power supply rail 112 shown in FIGS. 1 and 2. Means for processing the sensed second power supply voltage may include a feedback circuit, such as the feedback circuit 202 portrayed in FIG. 2. Means for controlling the means for generating the first power supply voltage based on the processed second power supply voltage may include a control signal, an adjustment signal, or a modulation signal, such as the injection current $I_{inj}$ illustrated in FIG. 2 or the differential injection current $I_{injp}/I_{injm}$ shown in FIGS. 3, 5, 6, and 8. Means for distributing a dock signal may include a dock distribution network, such as the dock distribution chain 100 shown in FIG. 1. First means for driving the clock signal may include one or more dock drivers, such as the first set of logic inverters 102 depicted in FIG. 1. Second means for driving the dock signal may include one or more dock drivers, such as the second set of logic inverters 104 portrayed in FIG. 1.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A circuit comprising:
   a first power supply circuit, implemented as a linear regulator and configured to generate a first power supply voltage on a first power supply rail;

a second power supply circuit, implemented as a switching regulator and configured to generate a second power supply voltage on a second power supply rail;
a clock distribution network comprising:
   a first set of one or more clock drivers having power supply inputs coupled to the first power supply rail; and
   a second set of one or more clock drivers coupled to the first set of one or more clock drivers and having power supply inputs coupled to the second power supply rail; and
a feedback circuit coupled between the second power supply rail and at least one input of the first power supply circuit, the feedback circuit being configured to:
   sense the second power supply voltage;
   process the sensed second power supply voltage; and
   output at least one feedback signal to control the first power supply circuit based on the processed second power supply voltage.

2. The circuit of claim 1, wherein the at least one feedback signal comprises at least one current signal and wherein the feedback circuit comprises a transconductance stage having at least one output coupled to the at least one input of the first power supply circuit.

3. The circuit of claim 2, wherein the feedback circuit further comprises a gain stage having at least one output coupled to at least input of the transconductance stage.

4. The circuit of claim 3, wherein the feedback circuit further comprises a bandpass filter coupled between the second power supply rail and at least one input of the gain stage.

5. The circuit of claim 3, wherein the feedback circuit further comprises:
   a first filter coupled between the second power supply rail and a first differential input of the gain stage; and
   a second filter coupled between the second power supply rail and a second differential input of the gain stage, the second filter being configured to have a different frequency response than the first filter.

6. The circuit of claim 5, wherein:
   the first filter and the second filter comprise low-pass filters configured to have different low-pass frequency responses; or
   the first filter and the second filter comprise high-pass filters configured to have different high-pass frequency responses.

7. The circuit of claim 5, wherein the gain stage comprises:
   a first transistor having a gate coupled to the first differential input of the gain stage and having a drain coupled to a first differential output of the gain stage;
   a second transistor having a gate coupled to the second differential input of the gain stage and having a drain coupled to a second differential output of the gain stage;
   a third transistor having a drain coupled to a third power supply rail and having a source coupled to the first differential output of the gain stage and to the drain of the first transistor;
   a fourth transistor having a drain coupled to the third power supply rail, having a source coupled to the second differential output of the gain stage and to the drain of the second transistor, and having a gate coupled to a gate of the third transistor; and
   a current sink coupled between sources of the first transistor and the second transistor and a reference potential node of the circuit.

8. The circuit of claim 7, wherein a gain of the gain stage is based on a ratio between:
   a first transconductance of the first transistor or the second transistor; and
   a second transconductance of the third transistor or the fourth transistor.

9. The circuit of claim 5, wherein the at least one output of the transconductance stage comprises a first differential output and a second differential output and wherein the transconductance stage comprises:
   a first transistor having a gate coupled to a first differential input of the transconductance stage and having a drain coupled to the first differential output of the transconductance stage;
   a second transistor having a gate coupled to a second differential input of the transconductance stage and having a drain coupled to the second differential output of the transconductance stage; and
   a current sink coupled between sources of the first transistor and the second transistor and a reference potential node of the circuit.

10. The circuit of claim 1, further comprising a bandgap reference having an output coupled to a first input of the first power supply circuit, wherein the first power supply rail is coupled to a second input of the first power supply circuit in a feedback loop.

11. The circuit of claim 10, wherein the first power supply circuit comprises:
   a first transistor having a gate coupled to the first input of the first power supply circuit and having a drain coupled to a first differential output of the feedback circuit;
   a second transistor having a gate coupled to the first power supply rail and to the second input of the first power supply circuit and having a drain coupled to a second differential output of the feedback circuit;
   a first current sink coupled between sources of the first transistor and the second transistor and a reference potential node of the circuit;
   a third transistor having a source coupled to a third power supply rail and having a drain coupled to a gate of the third transistor, to the drain of the first transistor, and to the first differential output of the feedback circuit;
   a fourth transistor having a source coupled to the third power supply rail, having a gate coupled to the gate and the drain of the third transistor, and having a drain coupled to the drain of the second transistor and to the second differential output of the feedback circuit;
   a fifth transistor having a drain coupled to the third power supply rail, having a source coupled to the first power supply rail, and having a gate coupled to the source of the fourth transistor, to the drain of the second transistor, and to the second differential output of the feedback circuit; and
   a second current sink coupled between the source of the fifth transistor and the reference potential node of the circuit.

12. The circuit of claim 2, wherein the feedback circuit further comprises:
   a first filter coupled between the second power supply rail and a first differential input of the transconductance stage; and
   a second filter coupled between the second power supply rail and a second differential input of the transconductance stage, the second filter being configured to have a different frequency response than the first filter.

13. The circuit of claim 12, wherein the at least one output of the transconductance stage comprises a first differential output and a second differential output and wherein the transconductance stage comprises:
- a first transistor having a gate coupled to the first differential input of the transconductance stage and having a drain coupled to the first differential output of the transconductance stage;
- a second transistor having a gate coupled to the second differential input of the transconductance stage and having a drain coupled to the second differential output of the transconductance stage; and
- a current sink coupled between sources of the first transistor and the second transistor and a reference potential node of the circuit.

14. The circuit of claim 1, wherein to process the sensed second power supply voltage, the feedback circuit is configured to:
- filter the sensed second power supply voltage;
- amplify the filtered second power supply voltage;
- convert the amplified second power supply voltage to a current signal; and
- invert the current signal to generate the at least one feedback signal.

15. A method of clock distribution, comprising:
- generating a first power supply voltage on a first power supply rail with a first power supply circuit, wherein the first power supply circuit is implemented as a linear regulator;
- generating a second power supply voltage on a second power supply rail with a second power supply circuit, wherein the second power supply circuit is implemented as a switching regulator;
- distributing a clock signal, the distributing comprising:
  - operating a first set of one or more clock drivers powered by the first power supply voltage;
  - operating a second set of one or more clock drivers powered by the second power supply voltage; and
  - outputting a driven version of the clock signal from the first set of one or more clock drivers as input to the second set of one or more clock drivers;
- sensing the second power supply voltage on the second power supply rail;
- processing the sensed second power supply voltage; and
- controlling the first power supply circuit based on the processed second power supply voltage.

16. The method of claim 15, wherein processing the sensed second power supply voltage comprises:
- filtering the sensed second power supply voltage;
- amplifying the filtered second power supply voltage;
- converting the amplified second power supply voltage to a current signal; and
- inverting the current signal to generate at least one feedback signal, wherein the controlling comprises controlling the first power supply circuit using the at least one feedback signal.

17. The method of claim 15, wherein during the controlling, the first power supply voltage has a first low frequency content with opposite polarity to a second low frequency content of the second power supply voltage.

18. A circuit comprising:
- a first power supply circuit configured to generate a first power supply voltage on a first power supply rail;
- a second power supply circuit configured to generate a second power supply voltage on a second power supply rail;
- a clock distribution network comprising:
  - a first set of one or more clock drivers having power supply inputs coupled to the first power supply rail; and
  - a second set of one or more clock drivers coupled to the first set of one or more clock drivers and having power supply inputs coupled to the second power supply rail; and
- a feedback circuit coupled between the second power supply rail and at least one input of the first power supply circuit, the feedback circuit comprising a filter stage and a transconductance stage.

19. The circuit of claim 18, further comprising a gain stage coupled between the filter stage and the transconductance stage.

* * * * *